US008686747B2

(12) United States Patent
Berner et al.

(10) Patent No.: US 8,686,747 B2

(45) Date of Patent: Apr. 1, 2014

(54) MONITORING A SUSPENSION AND TRACTION MEANS OF AN ELEVATOR SYSTEM

(75) Inventors: Oliver Berner, Sursee (CH); Micro Annen, Kussnacht am Rigi (CH)

(73) Assignee: Inventio AG, Hergiswil (CH)

(*) Notice: Subject to any disclaimer, the term of this patent is extended or adjusted under 35 U.S.C. 154(b) by 599 days.

(21) Appl. No.: 12/973,264

(22) Filed: Dec. 20, 2010

(65) Prior Publication Data

US 2011/0148442 A1 Jun. 23, 2011

(30) Foreign Application Priority Data

Dec. 21, 2009 (EP) .................................... 09180234

(51) Int. Cl.
*G01R 27/08* (2006.01)
*B66B 1/34* (2006.01)

(52) U.S. Cl.
USPC .......................................... 324/691; 187/391

(58) Field of Classification Search
USPC .......................................................... 324/691
See application file for complete search history.

(56) References Cited

U.S. PATENT DOCUMENTS

| | | | | |
|---|---|---|---|---|
| 5,477,089 A * | 12/1995 | Porter | .......................... | 307/10.1 |
| 7,123,030 B2 * | 10/2006 | Robar et al. | .................. | 324/693 |
| 2005/0133312 A1 * | 6/2005 | Kaczmarek et al. | .......... | 187/266 |
| 2008/0223668 A1 * | 9/2008 | Stucky et al. | ................ | 187/393 |

FOREIGN PATENT DOCUMENTS

| | | | | |
|---|---|---|---|---|
| DE | 3934654 A1 | 5/1991 | | |
| EP | 1357073 A1 | 10/2003 | | |
| WO | 2005094248 A2 | 10/2005 | | |
| WO | 2005095252 A1 | 10/2005 | | |
| WO | WO 2008/081074 * | 7/2008 | ................ | B66B 5/00 |

* cited by examiner

*Primary Examiner* — Jeff Natalini

(74) *Attorney, Agent, or Firm* — Fraser Clemens Martin & Miller LLC; William J. Clemens

(57) ABSTRACT

A monitoring device for a suspension-and-traction apparatus of an elevator system that includes at least one electrically conductive cord contains a measurement apparatus for determining a resulting resistance. The measurement apparatus is connected to the cord with contacting elements contacting opposite ends of cord. Damage to the suspension-and-traction apparatus is detected by a contact point that can register protruding conductive parts of the cord and, in another embodiment, the contacting elements each contain a plurality of mutually differing resistance elements such that each of at least two electrically conductive cords of the suspension-and-traction apparatus is connected to the monitoring device through two of the resistance elements.

14 Claims, 5 Drawing Sheets

MONITORING A SUSPENSION AND TRACTION MEANS OF AN ELEVATOR SYSTEM

FIELD OF THE INVENTION

The present invention relates to an elevator system, in which at least one elevator car, or at least one lift cage, and at least one counterweight are moved in opposite directions in an elevator hoistway, wherein the at least one elevator car and the at least one counterweight run along guiderails, are supported by one or more suspension-and-traction means, and are driven by a traction sheave of a drive unit. The present invention relates particularly to the one or more suspension-and-traction means, viz. to a method of monitoring the one or more suspension-and-traction means of the elevator system, and to a device according to the invention for executing this method.

BACKGROUND OF THE INVENTION

In elevator systems it has proved advantageous to use suspension-and-traction means that are composed of at least one electrically conductive steel rope and non-conductive sheath, or of ropes made of special plastics, in which an electric conductor is integrated. By this means, for the purpose of monitoring the individual suspension rope or ropes—also known as cords—a monitoring current can be applied. In the electric circuit so formed, or in several so-formed electric circuits, the current flow or current strength, the voltage, the electrical resistance, or the electric conductivity, is measured and provides information about the intactness and/or degree of wear of the suspension-and-traction means.

So, for example, the published patent application DE 39 34 654 A1 discloses a serial connection of all of the individual cords and an ammeter, or, instead of an ammeter, an electronic circuit, in which the base resistance of an emitter-connected transistor is measured.

U.S. Pat. No. 7,123,030 B2 discloses a calculation of the electrical resistance through a measurement of the momentary voltage by means of a so-called Kelvin bridge, and a comparison of the voltage value determined by this means with an input reference value.

International patent publication WO 2005/094250 A2 discloses a temperature-dependent measurement of the electrical resistance value, or of the electrical conductance, in which the varying ambient temperature, and hence also the assumed temperature of the suspension means, is taken into account, which, particularly in tall elevator hoistways, can greatly vary.

A further international patent publication, WO 2005/094248 A2, discloses special circuits of the individual cords, to avoid electric fields and to avoid orthogonally migrating ions between the individual cords.

A European patent publication, EP 1 275 608 A1, of an application by the same applicant as for the present application, discloses a monitoring of the sheath by application to the cords of a plus-pole of a source of direct current, so that in the case of a damaged sheath, a mass contact occurs.

However, disadvantageous in all of these known monitorings of the suspension-and-traction means is that the information about the signs of wear, or about the prevailing anomalous state of the suspension-and-traction means, is present only as an overall result. In particular, cross-connections (short circuits) between cords greatly falsify the overall result.

SUMMARY OF THE INVENTION

An objective is therefore now to eliminate the said disadvantages of conventional monitoring devices, and to propose a monitoring device for suspension-and-traction means that delivers more accurate and qualitatively classifiable information about its state, thereby achieving a higher level of safety for the elevator system, and avoiding cost-intensive excessively early replacements of the suspension-and-traction sheaves.

A fulfillment of the objective consists in the first place in the arrangement of an electric circuit that can be applied to the suspension-and-traction means and contains at least two electric resistors, or resistance elements, which possess different resistance characteristics. In the individual case, this can be the resistance value itself, in principle, however, also the tolerance, the maximum power loss, the temperature coefficient, or, taking the same into consideration, the breakdown voltage, the stability, the (parasitic) inductance, the (parasitic) capacity, the noise, the impulse stability, or combinations thereof.

A first variant of a corresponding arrangement thus foresees a suspension-and-traction means that possesses at least one conductive cord. This suspension-and-traction means is largely sheathed, advantageously with an electrically insulating material such as, for example, rubber or a polyurethane. Connected to each of the conductive ends of the cord are mutually differing resistors. Additionally or alternatively, a further resistor, which differs again from the first two mutually differing resistors, is arranged on a contact point which is passed over by the suspension-and-traction means when in operation.

This contact point can, for example, be any return pulley, whether a return pulley that is arranged locationally-fixed in the elevator hoistway, or the, or one of the, return pulley(s) of the counterweight or of the elevator car. As a contact point, which is passed over by the suspension-and-traction means, a so-called retainer can also be considered, i.e. an anti-derailer, such as return pulleys usually have. Also, diverter pulleys of the counterweight, or of the elevator car, and in principle also the traction sheave, as well as metallic hoistway components, can be considered. The contact point can be a metallic surface, which, for example, is coated with a highly conductive material, such as copper or brass. Also brush contacts, in the form of, for example, carbon fiber brushes, copper brushes, or similar, can be used. The use of brushes has the advantage that the brushes enter into close contact with a surface of the suspension-and-traction means, i.e. that they, for example, exactly follow a contoured, or formed, surface, so that the entire surface is contacted. However, of primary importance is that the contact point is conductive, and advantageous that it can be grounded—in the case of operation of the monitoring device with direct current—or that a voltage can be applied to the contact point—in the case of operation of the monitoring device with alternating current—and that a contact with the conductive part, or conductive parts, of a suspension-and-traction means is possible in principle if this conductive part of the suspension-and-traction means comes into contact with this contact point.

This last-mentioned contact between the contact point, for example the return pulley, and the conductive part or conductive parts of the suspension-and-traction means can arise when, for example, individual wires of the cord break, and subsequently penetrate through the sheath. These broken wires touch against the contact point and thus, during the time of their touching, create an electric contact. Thus, by an analysis of the resulting total resistance, or of a corresponding current characteristic, both a discontinuity of a cord, a cross-current or a short circuit between cords, or damage to the sheath, or penetration of individual wires can be detected.

In an independent solution, this contact between the contact point and conductive parts of the suspension-and-traction means can also be used alone as an indication of damage to the suspension-and-traction means. In this solution, it is even possible to dispense with a resistor, except when a plurality of different resistors is arranged at different contact points. In an advantageous variant embodiment, this contact point is a sliding contact, or a contact point that is, for example, arranged at a small distance from the suspension-and-traction means. This contact point can be any part of the elevator system that the suspension means passes over. This can be, for example, a machine console in the vicinity of the drive machine, or it can be a component part of the car, or it can also be a protective guard or retainer. This contact point is advantageously arranged at a distance ranging from about 1 mm to 15 mm. In an advantageous embodiment, this distance can be set. Achieved by this means is that only true damage to the suspension-and-traction means results in a contact, while small signs of wear are ignored. The contact point is self-evidently embodied electrically conductively.

Alternatively, the known contact between the contact point, for example the return pulley, and the conductive part, or conductive parts, of the suspension-and-traction means can also be realized, in that, for example, the conductive cord of the suspension-and-traction means is not completely, but only largely, sheathed with non-conductive plastic. Contiguous conductive sections, or even complete parts of the circumference of the cross section, remain free, which extend over the entire length of the suspension-and-traction means, and can come into electrical contact with the return pulley. A further possibility for creating the contact between the cord and the return pulley, or between the contact point and the third resistor, is the integration of conductive strands in the sheath of the suspension-and-traction means. In principle, also a suspension-and-traction means with a conductive sheath is possible, but which then preferably has an insulation layer between the conductive cord and the conductive sheath.

A further variant foresees a suspension-and-traction means that has a plurality of parallel-running conductive cords. Also this suspension-and-traction means is largely sheathed. Connected to each of the conductive ends of the cord are mutually differing resistance elements, or resistors with specific characteristics, that are assigned to the individual cords. Arranged additionally if required is a single further resistor, which differs again from the other resistors, which, as explained above for the example of a single cord, is arranged on a contact point that is passed over by the suspension-and-traction means when in operation.

The mutually differing resistances, or resistance elements, that are arranged at the ends of the conductive cord and/or at the ends of the suspension-and-traction means are preferably integrated in contacting elements, as disclosed, for example, in European publication EP 127 56 08 A1. The contacting elements that are published in that document can be arranged not only at the ends of the suspension-and-traction means, but optionally also in between. Further contacting elements, in which the two mutually differing resistors at the ends of the conductive cord, and/or at the ends of the suspension-and-traction means, can preferably be integrated, are, for example, disclosed in the publication documents WO 2005/094249 A2, WO 2005/094250 A2 and WO 2006/127059 A2. The differing resistance elements can also be connected to the ends of the suspension-and-traction means, or integrated in these ends. Other arrangements of the resistors are also possible.

Hence, they can be integrated in the connection conductor between the contacting element and a corresponding measurement apparatus.

The mutually differing resistors or resistance elements are connected with a measurement apparatus, or with a corresponding source of electric current, in such manner that, depending on the respective fault possibility, certain total resistances, current strengths, or—with constantly maintained current source—specific voltages result in the overall circuit. The respective measurement values that are obtained can thus be assigned to a respective incidence of damage. The measurement can be interrogated permanently, as well as at intervals, or only as required before and/or during each travel as a corresponding condition for release of a travel.

Further, variant embodiments of a such a monitoring device are realizable which, whether in combination with only one, or more than one, cords, and the corresponding number of mutually differing resistors, in case of need have not only one contacting point, over which the suspension-and-traction means passes, but also in case of need can be embodied with a plurality of contacting points.

As already stated, respective instances of damage can be cord-breakage, cross-circuit (short circuit between two cords), breakthrough, or a combination thereof.

In principle, with a monitoring device that is embodied in this manner, it is possible to determine the "quality" of an impending cord-break, since the specific resistance of a single cord increases when its cross-sectional area decreases due to increasing breakage of the individual strands. It is, however, preferable to select the mutually differing resistors at the ends of the cords with a magnitude that is a factor greater than the specific resistance of the cord, this factor lying in a range from 500 to 1500, but preferably having a value of approximately 1000. In this manner, a reliable independence of the measurement signal from the mutually differing resistances of the specific resistance of the cord is assured, which varies not only as a function of the cross-sectional area, but also in response to temperature differences which, in a tall elevator hoistway, can be considerable.

Because in an alternative, in addition to registering the total resistance of the at-least two mutually differing resistors, arranged in between is a contact point to a third resistor, which differs again from the at-least two resistors, it is possible to localize a cord-break, a cross-circuit, or a breakthrough of a cord, to a contact point or a combination thereof. The localization can take place in relation to the cord in question, or it can take place in relation to control data of the elevator system, and to an instant in time of the contact registration at the contact point. This takes place on the basis of the known information, where the contact point is arranged fixed, and/or the known elevator-car position, and/or a time measurement from putting the elevator system into travel, so that, based on the operating speed of the elevator system, the distance traveled by the suspension-and-traction means is calculable. This known, or calculated, position information is compared with the occurrence of a measurement signal at the third resistor, which is arranged in the contact point, or with the occurrence of a change in the measurement signal of this third resistor, and the occurrence of a change in the measurement signals in the at-least two first resistors, and thereby gives the position of an incidence of damage in the suspension-and-traction means. Preferably, the registering and/or calculation of these described values takes place with the aid of a processor, and automatically, and can be displayed on a display or monitor. The processor is preferably further able to store incidences of damage, and thereby to create a damage-accumulation picture.

Particularly in a monitoring device of this type for a suspension-and-traction means with a plurality of cords, and/or in a corresponding elevator system, it is possible, also preferably by means of the aiding processor, to evaluate the extent of the damage of the entire suspension-and-traction means in relation to the number of damaged spots, and in relation to the extent of a respective individual damaged spot, and thereby to issue a graded warning message. It can be realized, for example, that a suspension-and-traction means with, for example, 12 cords, of which one is broken, or in one of which a cross-circuit occurs only rarely and with low intensity, can still be used for a defined period of time without reservation. This defined safe period is registered by the processor and further shortened, or results in a standstill of the elevator system, if the extent of the damage should correspondingly increase, and/or a further incidence of damage should additionally occur.

By way of example, the following table shows examples of measurement values and incidences of damage that can occur. The following Table 1 shows possible measurement values of the total resistance in an exemplarily assumed example circuit of a monitoring device according to the invention for two cords A and B. Arranged at the one end of the first cord A is, for example, a resistor of 1 ohm, and at the other end of this first cord A is, for example, a resistor of 1.1 ohms. Arranged on the second cord B are, for example, identical resistors, but arranged mirror-inverted, i.e. at the one end of the second cord B is, for example, a further resistor of 1.1 ohms, and at the other end of this second cord B is, for example, a further resistor of 1 ohm. Arranged at the contact point (P), over which the suspension-and-traction means passes, is, for example, a fifth resistor, of 1.5 ohms. Assumed as voltage source is a direct-current source with a voltage of, for example, 1 volt.

Possible measurement values of the total resistance are therefore—

TABLE 1

| Incidence of damage | | Cord break | | | |
|---|---|---|---|---|---|
| Cross-circuit | | None | A | B | A + B |
| | None | 1.050 | 2.100** | 2.100** | ∞** |
| | A-B | 1.048 | —** | —** | —** |
| | A-B (before break) | — | 1.624** | 1.524** | 2.200** |
| | A-B (after break) | — | 1.524** | 1.624** | 2.000** |
| | A-P | 0.939 | —** | 1.700** | —** |
| | A-P (before break) | — | 1.162** | —** | 2.600** |
| | A-P (after break) | — | 2.100** | —** | ∞** |
| | B-P | 0.919 | 1.635** | —** | —** |
| | B-P (before break) | — | —** | 1.141** | 2.500** |
| | B-P (after break) | — | —** | 2.100** | ∞** |
| | A-B-P | 0.912* | —** | —** | —** |
| | A-B-P (before break) | —* | 1.158** | 1.124** | 2.024** |
| | A-B-P (after break) | —* | 1.388** | 1.488** | ∞** |

where the measurement values marked with * are, for example, only a warning, and the measurement values marked with **, on the other hand, are followed by a shutdown of the elevator system. Possible measurement values of the current strength measured in an ammeter are—

TABLE 2

| Incidence of damage | | Cord break | | | |
|---|---|---|---|---|---|
| Cross-circuit | | None | A | B | A + B |
| | None | 0.952 | 0.476** | 0.476** | 0.000** |
| | A-B | 0.955 | —** | —** | —** |
| | A-B (before break) | — | 0.616** | 0.656** | 0.455** |

TABLE 2-continued

| Incidence of damage | Cord break | | | |
|---|---|---|---|---|
| A-B (after break) | — | 0.656** | 0.616** | 0.500** |
| A-P | 1.064 | —** | 0.588** | —** |
| A-P (before break) | — | 0.861** | —** | 0.385** |
| A-P (after break) | — | 0.476** | —** | 0.000** |
| B-P | 1.088 | 0.612** | —** | —** |
| B-P (before break) | — | —** | 0.876** | 0.400** |
| B-P (after break) | — | —** | 0.476** | 0.000** |
| A-B-P | 1.096* | —** | —** | —** |
| A-B-P (before break) | —* | 0.863** | 0.890** | 0.494** |
| A-B-P (after break) | —* | 0.720** | 0.672** | 0.000** |

Also in a monitoring device that is intended for suspension-and-traction means with a plurality of cords, the resistance elements, and/or the resistors, are preferably arranged mirror-inverted. In other words, in the case of three cords, the mutually differing resistors at the one adjacent ends of the cords have the characteristics x, y, z, while the resistors at the other adjacent ends of the cords have the characteristics z, y, x. The sum of the two resistors that are arranged in this manner on a single cord remains constant. Also, the sum of the resistors that are arranged in parallel at the one ends, preferably in one single first contacting element for all of the cords, and/or the sum of their characteristics x+y+z, is hence identical to the sum of the resistors that are arranged in parallel at the other ends, also preferably in one single second contacting element for all of the cords, and/or to the sum of their characteristics z+y+x. This does not impair the usability of the measurement results that are obtained, and brings the advantage of less expensive series manufacture.

To avoid falsification of the measurements, which can take place continuously, hence also during standstill of the elevator system, only during a travel, and/or before a travel, it is foreseen to conduct static charges of the elevator system away through a grounding, either continuously, or at least before a measurement takes place.

The disclosed monitoring devices are preferably combinable with a reverse-bending counter, so that a further information flows into the—preferably processor-aided—monitoring device, and hence the detection of the need for replacement of a suspension-and-traction means becomes even more reliable.

So far in the present application, mutually differing resistance elements have been disclosed. Instead of with resistors, a monitoring device is, however, also additionally, or entirely, realizable with other electronic components, for example with capacitors and coils. Here, on application of an alternating current, preferably the frequency, the inductance, the capacity, or combinations thereof, are measured. Hence, in what follows below, an arrangement and a measurement of a plurality of mutually differing "resistance elements" is claimed, which as generic term can comprise the said electronic components. The measurement can relate to the following current parameters: to the resistance and/or to a resistance characteristic that is listed above, to the current strength, to the voltage, to the frequency, to the inductance, to the capacitance, or to a combination thereof.

In summary, such a monitoring device brings the following advantages:

In contrast to a simple continuity test, the measurement values are quantifiable and qualifiable, and hence, more precise, and graded warning messages can be generated.

The damaged points can be localized in the entire length of the suspension-and-traction means.

A cumulative damage picture can be created.

The measurement values are largely independent of the specific resistance of a cord.

Despite the presence of a possible cross-circuit, a cord-break remains detectable.

The low number of only two connection points due to the combined contacting elements.

DESCRIPTION OF THE DRAWINGS

The invention is explained in greater detail symbolically and exemplarily by reference to figures. The figures are described interrelatedly and overall. Identical reference symbols indicate identical components, reference symbols with different indices indicate functionally identical or similar components. Shown are.

DESCRIPTION OF THE PREFERRED EMBODIMENT

The following detailed description and appended drawings describe and illustrate various exemplary embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
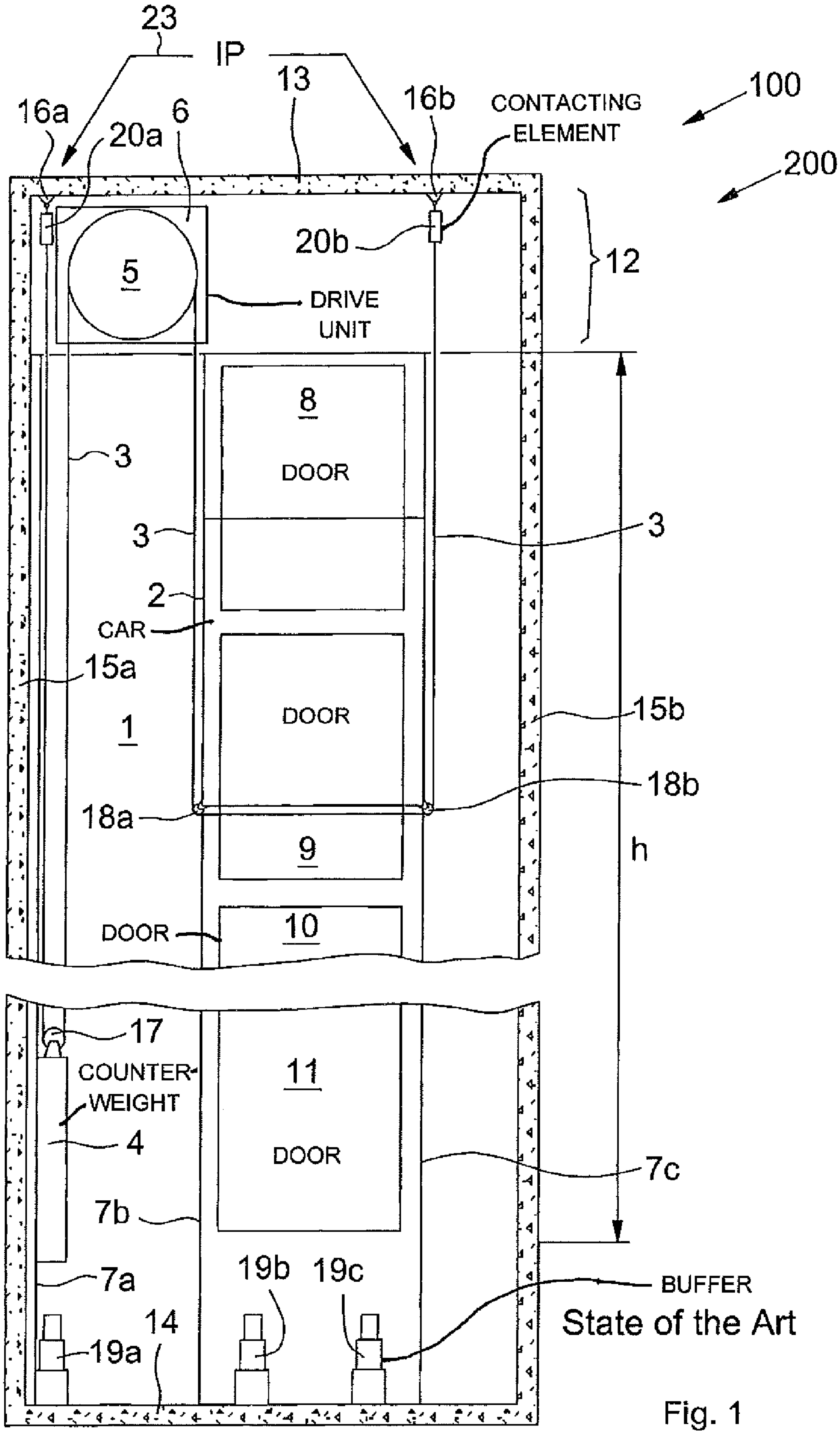
FIG. 1 is a diagrammatic illustration of an exemplary elevator system with a monitoring device for the suspension-and-traction means according to the state of the art.

FIG. 1 shows an elevator system 100 as known from the state of the art, for example in the 2:1 roping arrangement that is shown. Arranged movably in an elevator hoistway 1 is an elevator car 2, which is connected via a suspension-and-traction means 3 to a movable counterweight 4. In operation, the suspension-and-traction means 3 is driven by a traction sheave 5 of a drive unit 6, which is arranged in a machine room 12 in the top area of the elevator hoistway 1. The elevator car 2 and the counterweight 4 are guided by means of guiderails 7*a* or 7*b* respectively, and 7*c*, which extend over the height of the hoistway.

With a hoisting height h, the elevator car 2 can serve a top hoistway door 8, further hoistway doors 9 and 10, and a bottom hoistway door 11. The elevator hoistway 1 is formed of hoistway side-walls 15*a* and 15*b*, a hoistway ceiling 13, and a hoistway floor 14, arranged on which latter is a hoistway-floor buffer 19*a* for the counterweight 4, and two hoistway-floor buffers 19*b* and 19*c* for the elevator car 2.

The suspension-and-traction means 3 is fastened to the hoistway ceiling 13 at a locationally-fixed fastening point or suspension-means hitch-point 16*a*, and passes parallel to the hoistway side-wall 15*a* to a suspension pulley 17 for the counterweight 4, from there back over the traction sheave 5 to a first return and suspension pulley 18*a*, and to a second return and suspension pulley 18*b*, passes under the elevator car 2, and to a second locationally-fixed fastening point or suspension-means hitch-point 16*b* on the hoistway ceiling 13.

Arranged in the vicinity of the first locationally-fixed fastening point or suspension-means hitch-point 16*a*, and in the vicinity of the second locationally-fixed fastening point or suspension-means hitch-point 16*b*, are respective first and second contacting elements 20*a* and on the respective ends of the suspension-and-traction means 3. Applicable to the contacting elements 20*a* and 20*b* is a symbolically drawn test circuit 23, with a test-current IP, with which, for example, a simple continuity test of the suspension-and-traction means 3 is realizable to function as a monitoring device 200.

Figure 2:
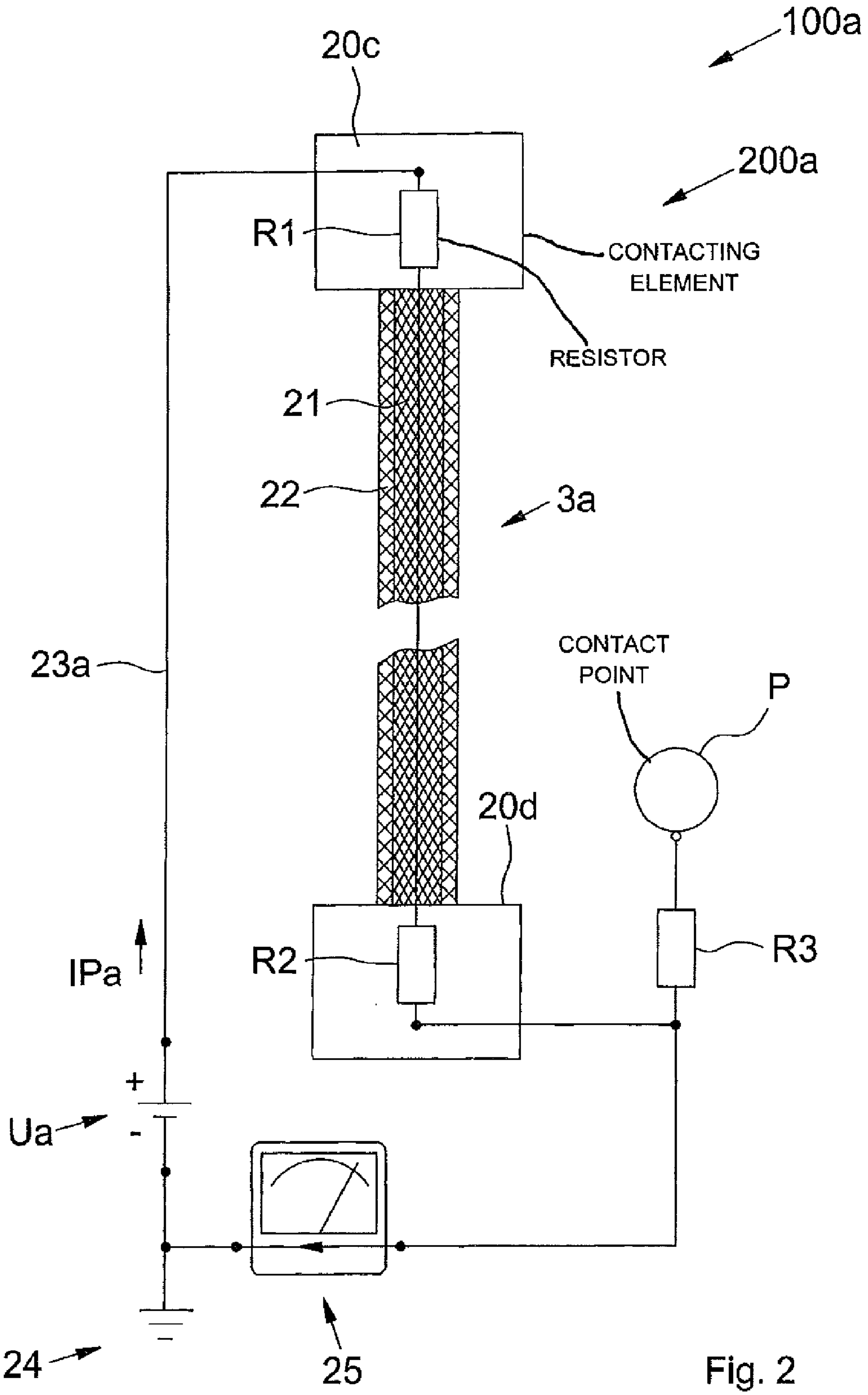
FIG. 2 is a diagrammatic illustration of a first variant embodiment of a monitoring device for a suspension-and-traction means with a cord.

FIG. 2 shows diagrammatically a monitoring device 200*a* in an elevator system 100*a*. Connected to the ends of a suspension-and-traction means 3*a*, which consists essentially of a cord 21 and a sheath 22 that largely surrounds this cord 21, are contacting elements 20*c* and 20*d* respectively. These contacting elements 20*c* and 20*d* preferably each have integrated in them a resistor R1, R2 respectively, to which a test circuit 23*a*, with a voltage source Ua and a test-current IPa, can be applied. Further, this test circuit 23*a* has a grounding 24 and a measurement apparatus 25, as well as an optional connection to a contact point P—for example a return pulley, over which the suspension-and-traction means 3*a* passes—with a third resistor R3. The resistors R1-R3 have mutually differing current and resistance characteristics so that, depending on a respective incidence of damage, the measurement apparatus 25 measures a classified measurement value that allows a diagnosis, and/or a graded warning message, and/or a shutdown of the elevator system 100*a*. The test circuit 23*a* can alternatively also be passed only over a contacting of the ends of the cord 21 and the contact point P. In this manner, damaged points in the suspension-and-traction means can be easily detected. The grounding 24 can also take place at another suitable point. So, for example, the contact point P can be connected directly to ground. By this means also, a plurality of contact points can be defined in the elevator system, each of which alone can detect defective spots in the suspension-and-traction means. Preferably, the registering and/or calculation of these described values takes place with the aid of a processor 30, and automatically, and can be displayed on a display or monitor. The processor 30 is preferably further able to store incidences of damage, and thereby to create a damage-accumulation picture.

Figure 2A:
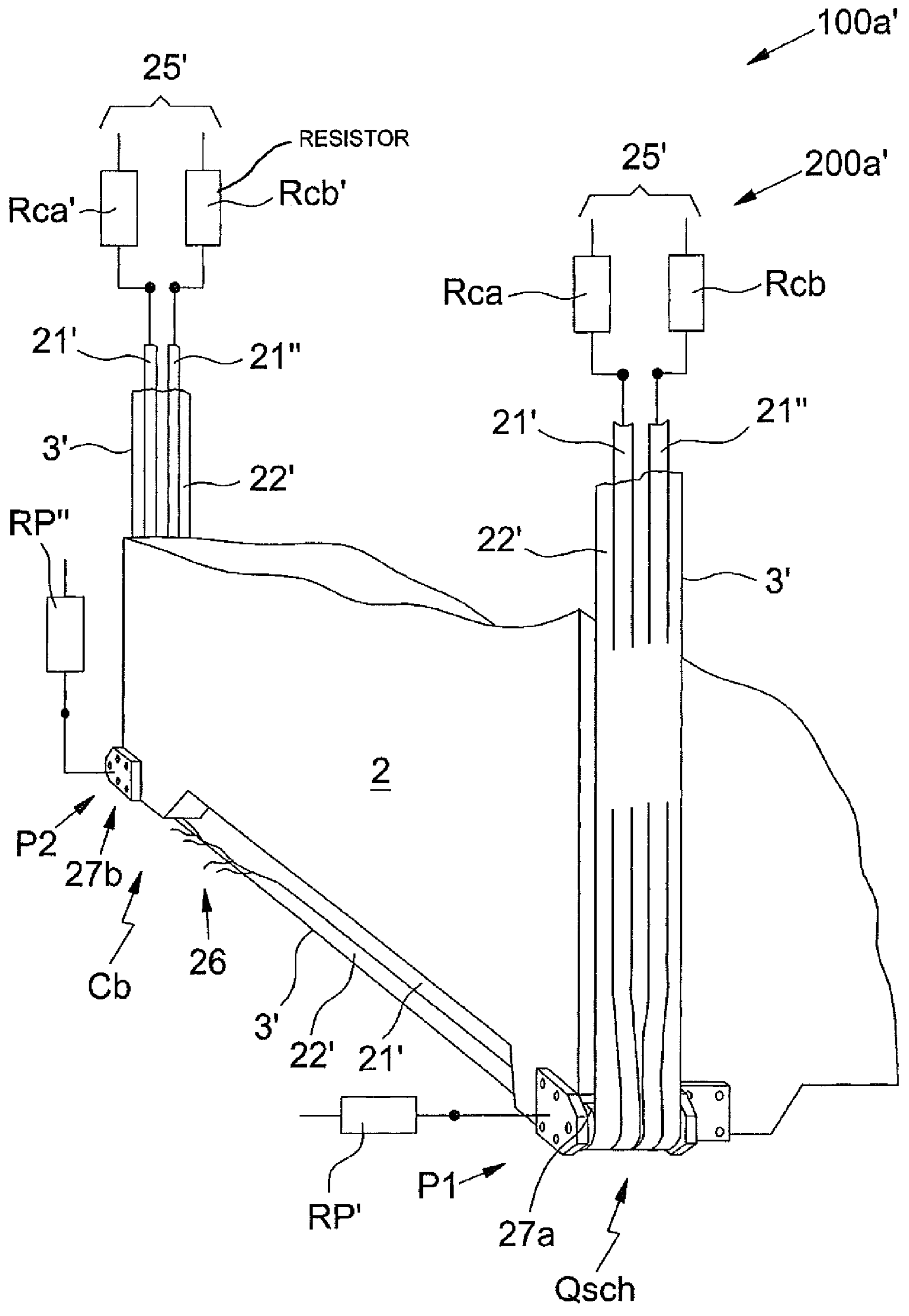
FIG. 2*a* is a schematic illustration of a second variant embodiment of a monitoring device for a suspension-and-traction means with two cords, at the same time illustrating a cross-circuit between the two cords, and an impending cord break of a cord.

Symbolically shown in FIG. 2*a* is a monitoring device 200*a*' in an elevator system 100*a*'. In contrast to the monitoring device 200*a* and the elevator system 100*a* of FIG. 2, a suspension-and-traction means 3' has two cords 21' and 21" which are surrounded by a sheath 22'. A corner and/or a side of the elevator car 2 is shown in perspective and symbolically so that, for example, it can be seen that the suspension-and-traction means 3'—and preferably a second, not further shown suspension-and-traction means passes on the opposite side of the elevator car 2—passing under the elevator car 2 over two return and/or suspension pulleys 27*a* and 27*b*. These return and/or suspension pulleys 27*a* and 27*b* form two optionally available contact points P1 and P2, which—shown symbolically—are connected to resistors RP' and RP" respectively.

As already disclosed, at their respective ends, the cords 21' and 21" are preferably also advantageously connected to resistors RCa and RCa' for the cord 21', and to resistors RCb and RCb' for the cord 21". The characteristics of the resistors RCa, RCa', RCb and RCb', as well as optionally the resistors RP', RP", all mutually differ, or the resistors RCa, RCb and RCa', RCb' at the ends of the cords 21' and 21" are arranged mirror-inverted in relation to their characteristics. In other words, the characteristics of the resistors RCa and RCb' and/or RCb and RCa' can also be identical. The ends of the suspension means are connected via the respective resistance elements RCa and RCb' and/or RCb and RCa' to the measurement apparatus 25'.

Furthermore, in this FIG. 2*a*, at the optional contact point P1, the incidence of damage of a cross-circuit Qsch is represented symbolically, in that it is outlined that the cords 21' and 21" no longer sit at a distance from each other in the sheath 22' but, for example, through a sheath 22' that has become damaged, become so close to each other that they enter into contact with each other.

The incidence of damage of an impending cord break Cb is symbolically shown at the also optional contact point P2. The cord 21' begins to unravel its individual strands 26 that protrude from the sheath 22' and thereby cause a contact at the return or suspension pulley 27*b*, or at its support. Self-evidently, monitoring of the contact points P1, P2 in the manner shown can also take place without resistors RCa, RCa', RCb and RCb'.

Figure 3:
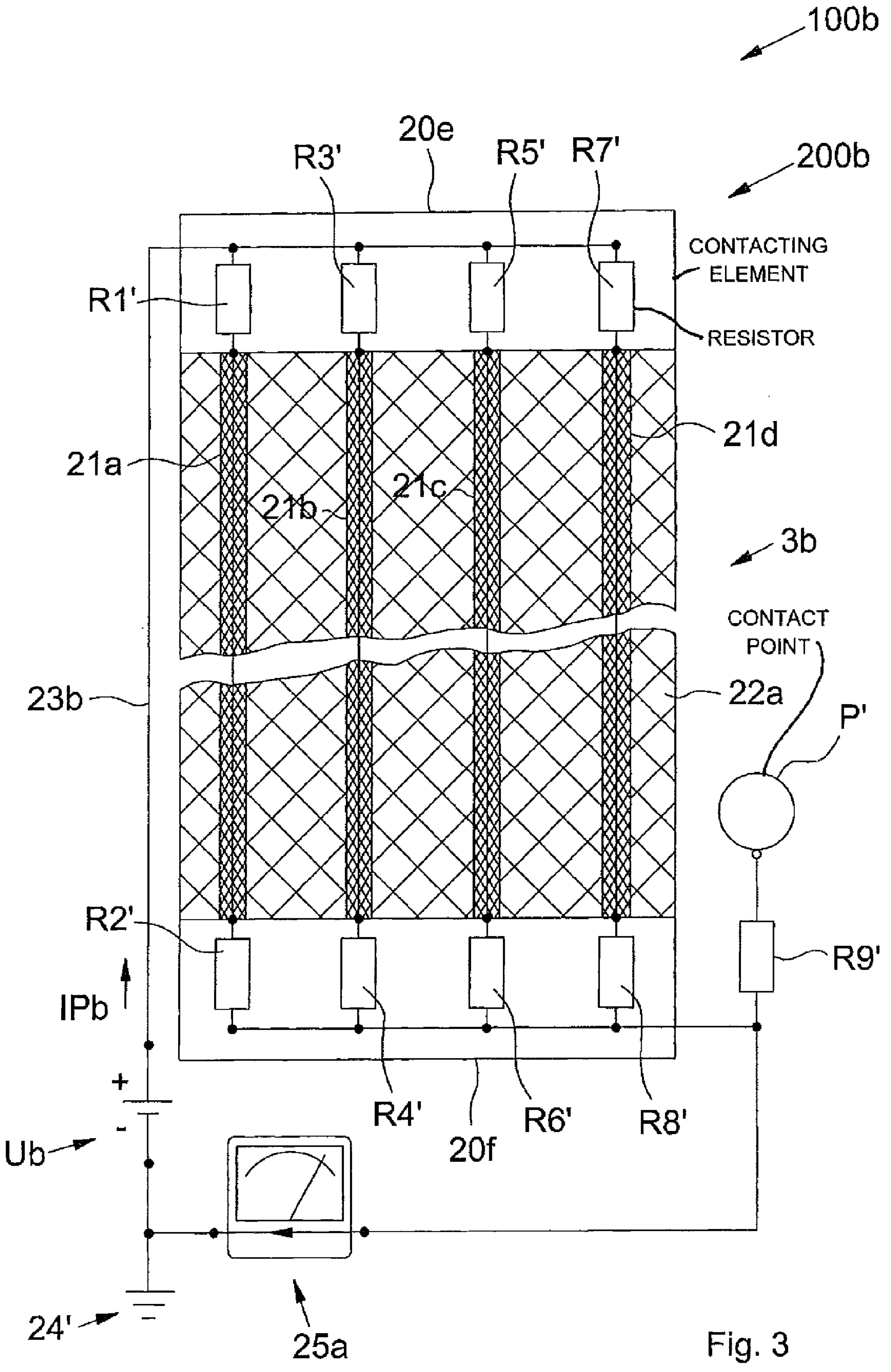
FIG. 3 is a diagrammatic illustration of another variant embodiment of a monitoring device for the suspension-and-traction means.

Shown diagrammatically in FIG. 3 is another variant embodiment of a monitoring device 200*b* for an outlined elevator system 100*b*. A suspension-and-traction means 3*b* has four cords 21*a*-21*d* which are jointly surrounded by a sheath 22*a*. Arranged at the respective ends of each of the cords 21*a*-21*d* are contacting elements 20*e* and 20*f*. Integrated in each of these contacting elements 20*e* and 20*f* are four resistors R1', R3', R5', R7' and R2', R4', R6', R8' respectively, which are connected to a test circuit 23*b* with a voltage source Ub, a test-current IPb, a grounding 24', and a measurement apparatus 25*a*. Furthermore, an optional contact point P' with a resistor R9' is connected to the test circuit 23*b*.

The resistors R1'-R9' all have different current characteristics, or are optionally arranged mirror-inverted. In other words, for example, the resistor R1' can have a current characteristic w, the resistor R3' a current characteristic x, the resistor R5' a current characteristic y, and the resistor R7' a current characteristic z, while the resistor R2' has the current characteristic z, the resistor R4' the current characteristic y, the resistor R6' the current characteristic x, and the resistor R8' the current characteristic w. The sums w+z, x+y, y+x, z+w and also w+x+y+z at the one adjacent ends of the cords 21*a*-21*d*, and z+y+x+w at the other adjacent ends, are identical. The current characteristic of the resistor R9' is different than w, x, y or z.

Figure 4:
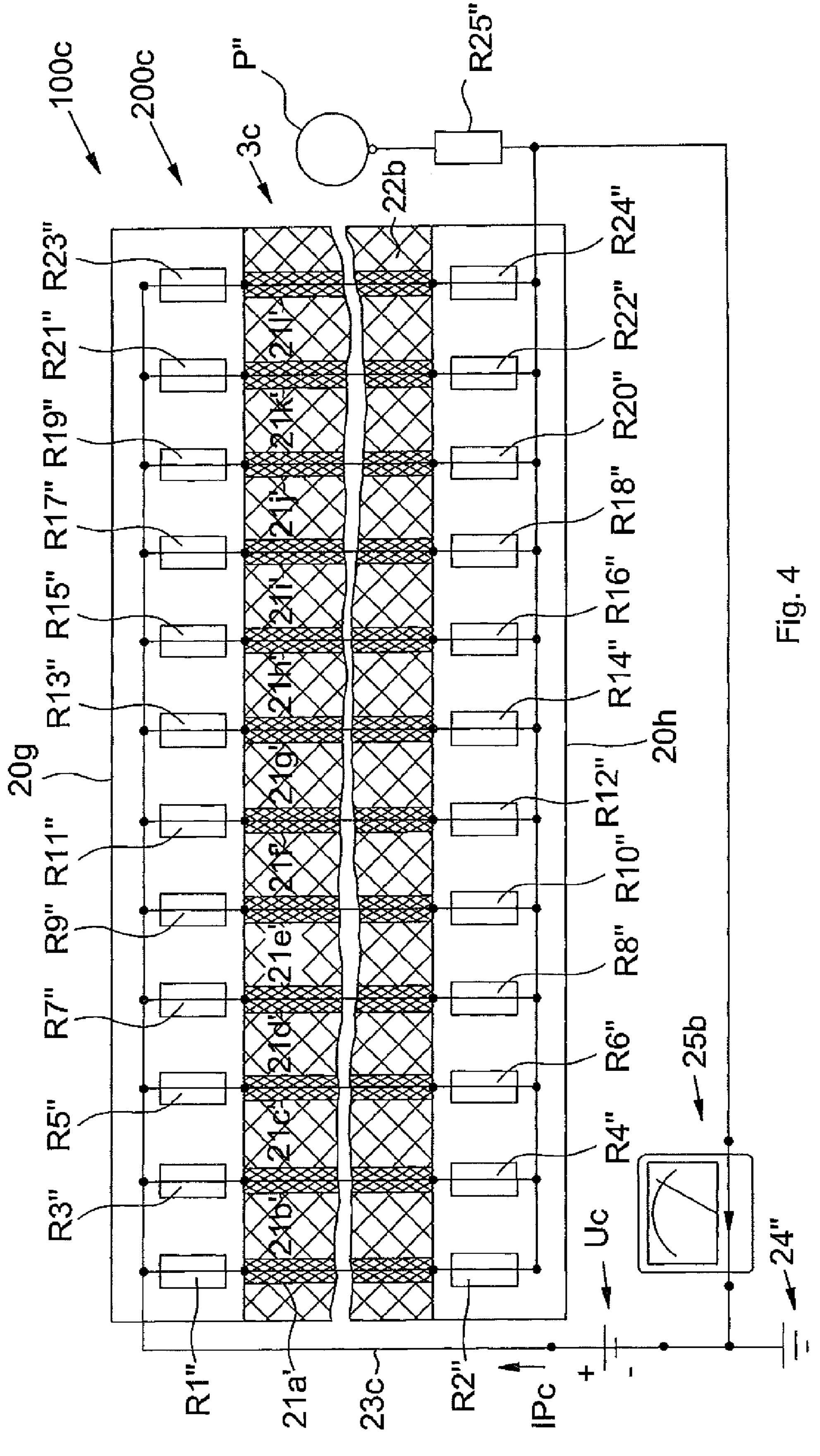
FIG. 4 is a diagrammatic illustration of a further variant embodiment of a monitoring device for the suspension-and-traction means.

Shown diagrammatically in FIG. 4 is a further variant embodiment of a monitoring device 200*c* for an outlined elevator system 100*c* with a suspension-and-traction means 3*c*. The suspension-and-traction means 3*c* has 12 cords 21*a'*-211', which are all jointly surrounded by a sheath 22*b*. Arranged at the one adjacent ends of the cords 21*a'*-21*l'* is a contacting element 20*g*, in which resistors R1", R3", R5", R7", R9", R11", R13", R15", R17", R19", R21" and R23" are preferably integrated, each individual resistor being assigned to one of the cords 21*a'*-21*l'*. Arranged at the other adjacent ends of the cords 21*a'*-21*l'* is a second contacting element 20*h*, in which, similar to the first contacting element 20*g*, resistors R2", R4", R6", R8", R10", R12", R14", R16", R18", R20", R22" and R24" are preferably integrated, each of which is also assigned to one of the cords 21*a'*-211'.

Similar to FIG. 3, the resistors R1"-R24" are connected to a test circuit 23*c* with a test-current IPc. The test circuit 23*c* has further a voltage source Uc, a grounding 24", and a measurement apparatus 25*b*. Also connected to the test circuit 23*c* is again an optional contact point P" with a resistor R25".

Also similar to FIG. 3, the resistors R1"-R23" with odd reference numbers in relation to their current characteristics are preferably arranged mirror-inverted to the resistors R2"-R24" with even reference numbers. The resistor R25", on the other hand, is preferably chosen different again from these twelve current characteristics.

The grounding 24 can, as described in the example of FIG. 2, be arranged at any point of the system. Thus, the contact point P can be connected directly to ground. Therefore, contact points can also be defined in the elevator system that, each by itself, in interaction with the monitoring device, can detect defective points in the suspension-and-traction means.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A monitoring device for a suspension-and-traction means of an elevator system, which suspension-and-traction means contains at least one cord that is electrically conductive, comprising:

a measurement apparatus for determining a resulting electrical resistance, and first and second contacting elements electrically connecting the measurement apparatus to the at least one cord of the suspension-and-traction means, wherein the first contacting element contacts a first end of the at least one cord, and the second contacting element contacts a second end of the at least one cord; and a resistor electrically connected to the measurement apparatus and to a contact point over which the suspension-and-traction means runs so that the monitoring device detects a contact of the contact point with the at least one cord of the suspension-and-traction means, and wherein the first and the second contacting elements each contain at least one resistor, so that the at least one cord of the suspension-and-traction means is electrically connected via the resistors of the contact elements to the measurement apparatus.

2. The monitoring device according to claim 1 wherein the contact point is one of a return pulley, a traction sheave and a sliding contact.

3. The monitoring device according to claim 1 wherein the contact point is arranged at a distance in a range of 1 mm to 15 mm from a surface of the suspension-and-traction means, so that a contact of the at least one cord is detected when electrically conductive parts of the at least one cord protrude the distance from the surface of the suspension-and-traction means and touch the contact point.

4. The monitoring device according to claim 1 wherein the first and second contacting elements each contain a plurality of mutually differing resistors, and connect the measurement apparatus to the at least one cord and to at least another cord of the suspension-and-traction means that is electrically conductive such that each end of each of the cords is connected to a respective one of the mutually differing resistors, and wherein a resistance of each of the mutually differing resistors is greater than a resistance of each of the cords by a factor lying in a range from 500 to 1500.

5. The monitoring device according to claim 1 including a processor for creating a damage-accumulation picture of the suspension-and-traction means of the elevator system.

6. The monitoring device according to claim 5 wherein the processor, in response to the damage-accumulation picture, or based upon an extent of damage, issues a graded warning message or stops the elevator system.

7. The monitoring device according to claim 1 wherein the first and second contacting elements each contain a plurality of mutually differing resistors, and connect the measurement apparatus to the suspension-and-traction means having a plurality of the electrically conductive cords such that each end of each of the cords is connected to a respective one of the mutually differing resistors, the mutually differing resistors of the first contacting element are arranged mirror-inverted relative to the mutually differing resistors of the second contacting element with respect to resistance values of the mutually differing resistors.

8. An elevator system having a suspension-and-traction means containing at least two cords that are electrically conductive, and a monitoring device having a measurement apparatus for determining a resulting electrical resistance and which, via a first contacting element for contacting a first end of the suspension-and-traction means and a second contacting element for contacting a second end of the suspension-and-traction means, is electrically connected to the at least two cords, comprising:

the monitoring device containing a first resistor electrically connected to the measurement apparatus and to a contact point over which the suspension-and-traction means runs, and wherein the measurement apparatus detects an electrical contact of the contact point with the at least two cords; and ends of the at least two cords each contain at least one resistor whereby the at least two cords are electrically connected by associated ones of the resistors to the measurement apparatus.

9. The elevator system according to claim 8 wherein the contact point is one of a return pulley, a traction sheave, and a sliding contact.

10. The elevator system according to claim 8 wherein the resistors have mutually differing resistances, each of the at least two cords being connected in series between an associated pair of the resistors, and the at least two cords with the series connected resistors are connected together in parallel, and the measurement apparatus determines a resulting resistance of the parallel connection arrangement.

11. The elevator system according to claim 8 wherein the contact point is arranged at a distance in a range of 1 mm to 15 mm from the suspension-and-traction means, whereby a contact of one of the at least two cords with the contact point is detected when electrically conductive parts of the one cord protrude the distance from the suspension-and-traction means.

12. The elevator system according to claim 8 wherein the contact point is a brush contact that is guided in almost contact along a contoured surface of the suspension-and-traction means, so that a contact of the at least two electrically conductive cords is detected when electrical parts of the cords protrude from the suspension-and traction means.

13. The elevator system according to claim 8 wherein the measurement apparatus determines the resulting resistance at least one of before and during a travel of the elevator system.

14. A method for monitoring a suspension-and-traction means in an elevator system comprising the steps of:

a. applying a test current to a test circuit connected to opposite ends of an electrically conductive cord of the suspension-and-traction means;

b. measuring at least one electric current characteristic of the test current with a measurement apparatus connected to the opposite ends and to a resistor and a contact point over which the suspension-and-traction means runs and determining a resulting resistance data, the data including detection of contact of the contact point with the cord;

c. electronic processing the data determined by the measurement apparatus with a processor; and d. issuing a graded warning message or a shutdown of the elevator system from the processor when the processed data indicates damage to the suspension-and-traction means.

* * * * *

UNITED STATES PATENT AND TRADEMARK OFFICE

CERTIFICATE OF CORRECTION

| | |
|---|---|
| PATENT NO. | : 8,686,747 B2 |
| APPLICATION NO. | : 12/973264 |
| DATED | : April 1, 2014 |
| INVENTOR(S) | : Oliver Berner and Mirco Annen |

It is certified that error appears in the above-identified patent and that said Letters Patent is hereby corrected as shown below:

On the Title Page

Item 75, Inventors:
Change “Micro Annen” to “Mirco Annen”

Signed and Sealed this
Sixteenth Day of September, 2014

Michelle K. Lee
*Deputy Director of the United States Patent and Trademark Office*